(12) United States Patent
Hokazono et al.

(10) Patent No.: US 10,062,650 B2
(45) Date of Patent: Aug. 28, 2018

(54) SEMICONDUCTOR DEVICE, AND SEMICONDUCTOR CHIP HAVING CHIP IDENTIFICATION INFORMATION

(71) Applicant: Mitsubishi Electric Corporation, Tokyo (JP)

(72) Inventors: Kazuya Hokazono, Tokyo (JP); Akihisa Yamamoto, Tokyo (JP); Dong Wang, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/324,094

(22) PCT Filed: Sep. 1, 2014

(86) PCT No.: PCT/JP2014/072911
§ 371 (c)(1),
(2) Date: Jan. 5, 2017

(87) PCT Pub. No.: WO2016/035117
PCT Pub. Date: Mar. 10, 2016

(65) Prior Publication Data
US 2017/0213795 A1 Jul. 27, 2017

(51) Int. Cl.
*H01L 23/544* (2006.01)
*G06K 19/07* (2006.01)
*H01L 21/66* (2006.01)

(52) U.S. Cl.
CPC ........ *H01L 23/544* (2013.01); *G06K 19/0722* (2013.01); *H01L 22/14* (2013.01);
(Continued)

(58) Field of Classification Search
CPC .................. H01L 23/544; H01L 2223/54486
(Continued)

(56) References Cited

U.S. PATENT DOCUMENTS 5,984,190 A 11/1999 Nevill
7,947,563 B2 5/2011 Aoki
(Continued)

FOREIGN PATENT DOCUMENTS

JP H08-213464 A 8/1996
JP H11-008327 A 1/1999
(Continued)

OTHER PUBLICATIONS

International Search Report issued in PCT/JP2014/072911; dated Nov. 25, 2014.

*Primary Examiner* — Toan Ly
(74) *Attorney, Agent, or Firm* — Studebaker & Brackett PC

(57) ABSTRACT

A semiconductor device employs at least one of semiconductor chip groups. The semiconductor device includes a semiconductor chip included in the semiconductor chip groups, and a package. The semiconductor chip includes an information recording region on which is recorded a first piece of identification information indicating to which group of the semiconductor chip groups the semiconductor chip belongs based on a first category. The information recording region includes a plurality of fuses selectively blown in accordance with the first piece of identification information. Indicated on the package is a second piece of identification information indicating to which group of the semiconductor chip groups the semiconductor chip belongs based on a second category. The first and second pieces of identification information are combined together to identify the semiconductor chip from among the semiconductor chip groups.

11 Claims, 17 Drawing Sheets

(52) U.S. Cl.
CPC ............... *H01L 2223/5444* (2013.01); *H01L 2223/54413* (2013.01); *H01L 2223/54433* (2013.01); *H01L 2223/54486* (2013.01); *H01L 2924/0002* (2013.01)

(58) Field of Classification Search
USPC ........................................................ 235/492
See application file for complete search history.

(56) References Cited

U.S. PATENT DOCUMENTS

| | | | |
|---|---|---|---|
| 8,298,920 B2 | 10/2012 | Aoki | |
| 2001/0021265 A1* | 9/2001 | Wilson | G05B 19/4183 382/145 |
| 2007/0202664 A1* | 8/2007 | Aoki | H01L 23/544 438/460 |
| 2007/0296403 A1* | 12/2007 | Mori | G06F 21/73 324/750.15 |

FOREIGN PATENT DOCUMENTS

| | | |
|---|---|---|
| JP | 2001-525993 A | 12/2001 |
| JP | 2005-191379 A | 7/2005 |
| JP | 2007-243132 A | 9/2007 |
| WO | 98/52226 A1 | 11/1998 |

\* cited by examiner

F I G . 6
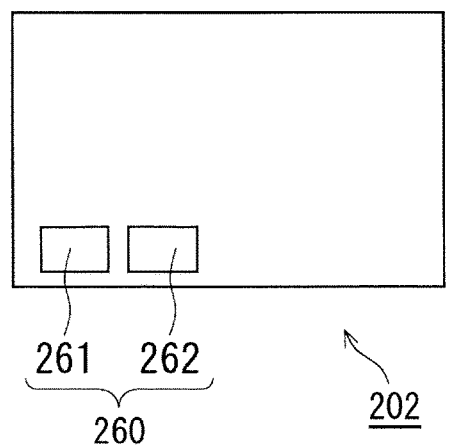
F I G . 7
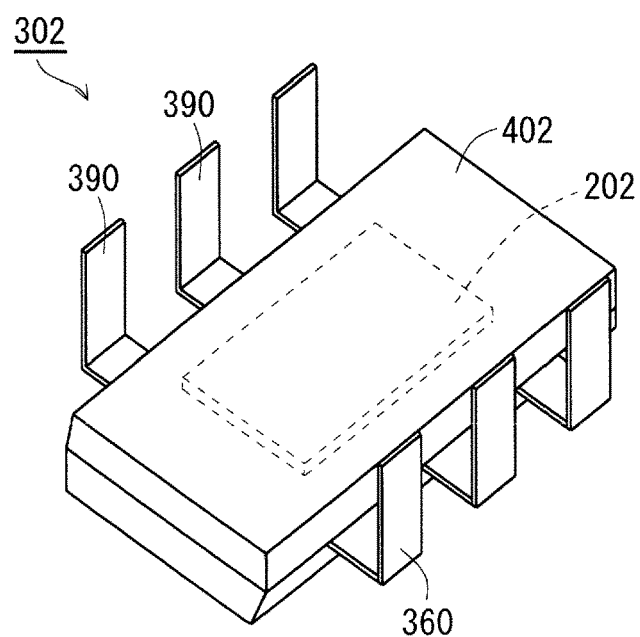

F I G . 8
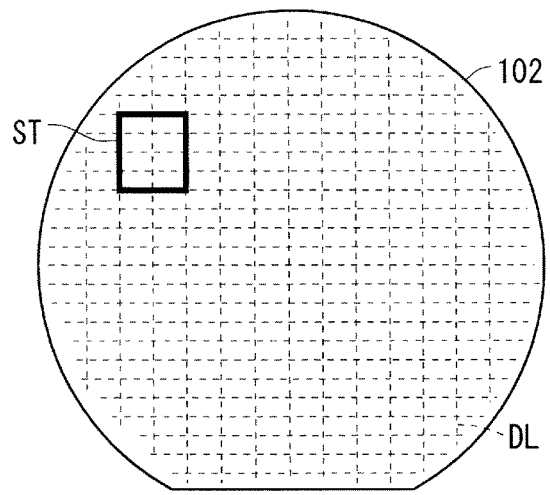
F I G . 9
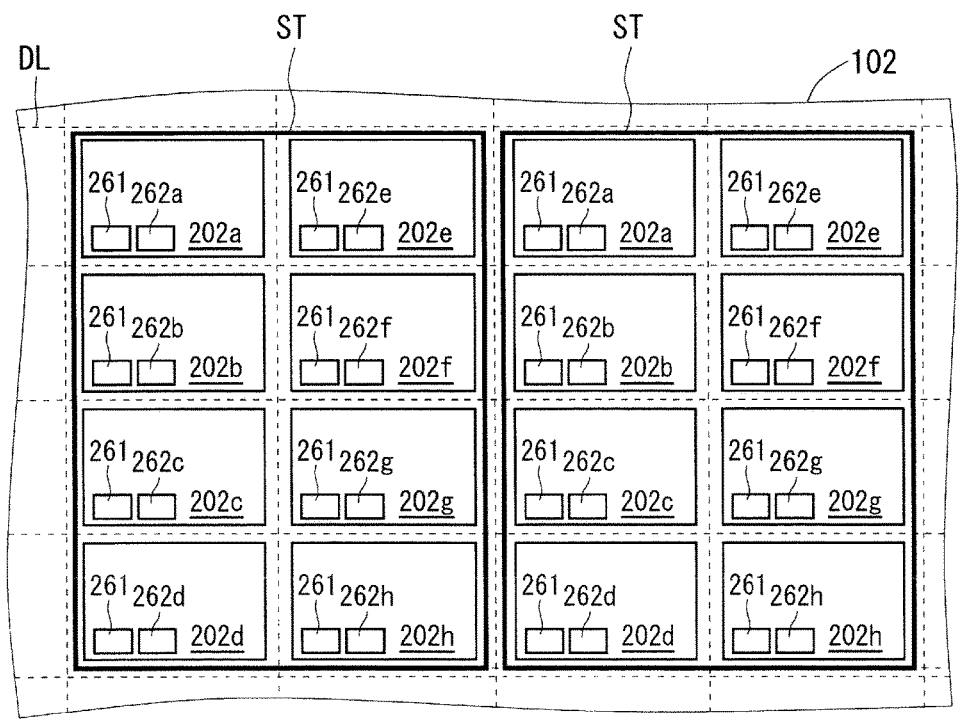

SEMICONDUCTOR DEVICE, AND SEMICONDUCTOR CHIP HAVING CHIP IDENTIFICATION INFORMATION

TECHNICAL FIELD

The present invention relates to a semiconductor device, a semiconductor chip, and a method for managing information on the properties of a semiconductor chip.

BACKGROUND ART

There is a typical semiconductor device including a package and a semiconductor chip sealed in the package. For example, an IC (Integrated Circuit) chip provided with a driving circuit for driving a power element such as a transistor and a diode is provided as the semiconductor chip in the package for a power module serving as the semiconductor device. In the manufacture of the semiconductor device, there are cases in which the traceability of the IC chip for use in the semiconductor device is required.

In Japanese Patent Application Laid-Open No. 11-8327 (1999) (Patent Literature 1), an identification code for identifying an individual IC chip is provided on a package. Examples of the identification code used in Patent Literature 1 include a manufacturing lot number and a semiconductor wafer number for a semiconductor wafer during the manufacture of IC chips, and coordinate locations of individual chips in the semiconductor wafer.

In Japanese Patent Application Laid-Open No. 8-213464 (1996) (Patent Literature 2), a fuse element provided on a chip is cut by a laser beam, based on the result of measurement as to whether the chip in a wafer state is good or not. Thus, identification information for identifying whether the electrical function of the chip is good or not is recorded on the chip. The chip may have an external terminal for electrically reading the information recorded on the fuse element to the outside.

CITATION LIST

Patent Literature

Patent Literature 1: Japanese Patent Application Laid-Open No. 11-8327 (1999)
Patent Literature 2: Japanese Patent Application Laid-Open No. 8-213464 (1996)

SUMMARY OF INVENTION

Technical Problem

When the identification code of an IC chip is added onto the package as disclosed in Japanese Patent Application Laid-Open No. 11-8327 (1999), it is impossible to make the size of the package smaller than the size required to put down the code. In particular, this problem becomes more significant when multiple IC chips are incorporated in the package. Thus, the addition of the identification code might constitute a restriction on the size reduction of the package.

When the fuse element is used as disclosed in Japanese Patent Application Laid-Open No. 8-213464 (1996), fuses equal in number to bits of information to be recorded are required. Thus, a large amount of information involves an enormous number of fuses, which in turn might result in an increased burden on the operation for blowout of the fuses for the recording of the information. Also, the need for a large area for placement of the fuses might result in the increase in the size of the semiconductor device. In addition, test results are recorded on the fuse element. Thus, when there arises a need to increase the details of a test, it might be necessary to change the pattern of IC chips for the purpose of accordingly increasing the number of fuse elements.

The present invention has been made to solve the aforementioned problems. It is therefore a primary object of the present invention to provide a semiconductor device capable of reducing the burden on operations for obtaining the traceability of a semiconductor chip while avoiding the occurrence of restrictions on the size reduction of a package. It is another object of the present invention to provide a semiconductor chip capable of reducing the burden on operations for obtaining the traceability of the semiconductor chip. It is still another object of the present invention to provide a method for managing information on the properties of a semiconductor chip which is easily adaptable to changes in details of a test on the semiconductor chip.

Solution to Problem

A semiconductor device according to the present invention employs at least one of semiconductor chip groups. The semiconductor device includes one semiconductor chip included in the semiconductor chip groups, and a package. The one semiconductor chip includes an information recording region on which is recorded a first piece of identification information indicating to which group of the semiconductor chip groups the one semiconductor chip belongs based on a first category. The information recording region includes a plurality of fuses selectively blown in accordance with the first piece of identification information. The package seals the semiconductor chip therein. Indicated on the package is a second piece of identification information indicating to which group of the semiconductor chip groups the one semiconductor chip belongs based on a second category. The first and second pieces of identification information are combined together to identify the one semiconductor chip from among the semiconductor chip groups.

A semiconductor chip according to the present invention is one of semiconductor chip groups. The semiconductor chip includes first and second partial recording regions. Recorded on the first partial recording region is a first piece of identification information indicating to which group of the semiconductor chip groups the one semiconductor chip belongs based on a first category. The first partial recording region includes a plurality of fuses selectively blown in accordance with the first piece of identification information. Recorded on the second partial recording region is a second piece of identification information indicating to which group of the semiconductor chip groups the one semiconductor chip belongs based on a second category. The second partial recording region includes a circuit pattern patterned in accordance with the second piece of identification information. The first and second pieces of identification information are combined together to identify the one semiconductor chip from among the semiconductor chip groups.

A method for managing property information on a semiconductor chip manages individual property information that is a property inherent in each semiconductor chip group. The method includes the following steps. The individual property information is acquired by tests for the semiconductor chip group. At least part of chip identification information which allows one semiconductor chip to be identified from among the semiconductor chip group is recorded on an information recording region of the semiconductor chip. At least one information output electrode is provided during manufacture of a semiconductor device by sealing said one semiconductor chip with a package. The information output electrode is electrically connected to the information recording region of the semiconductor chip and extending to the outside of the package during the manufacture of a semiconductor device. A combination of the chip identification information on the one semiconductor chip and the individual property information is stored in a property information storage device.

Advantageous Effects of Invention

In the semiconductor device according to the present invention, the pieces of identification information for ensuring the traceability of the semiconductor chip are recorded separately on the semiconductor chip and the package which seals the semiconductor chip. This eliminates the need to indicate all pieces of identification information on the package to reduce the restriction on the outside shape design of the package. Also, there is no need to record all pieces of identification information on the semiconductor chip, which in turn reduces the information recording burden on the semiconductor chip.

In the semiconductor chip according to the present invention, the pieces of identification information for ensuring the traceability of the semiconductor chip are recorded in a shared manner on the fuses and the circuit pattern. This reduces the number of fuses required for the recording of the identification information to thereby reduce the information recording burden on the semiconductor chip.

In the method for managing the property information on a semiconductor chip according to the present invention, the property information storage device is capable of bringing the chip identification information and the individual property information on a semiconductor chip into correspondence with each other.

BRIEF DESCRIPTION OF DRAWINGS

FIG. 6 is a plan view schematically showing the configuration of the semiconductor chip according to a second embodiment of the present invention.

FIG. 7 is a perspective view schematically showing the configuration of the semiconductor device according to the second embodiment of the present invention.

FIG. 8 is a plan view schematically showing a step in a method for manufacturing the semiconductor chip shown in FIG. 6.

FIG. 9 is a partial enlarged view of FIG. 8.

DESCRIPTION OF EMBODIMENTS

Figure 1:
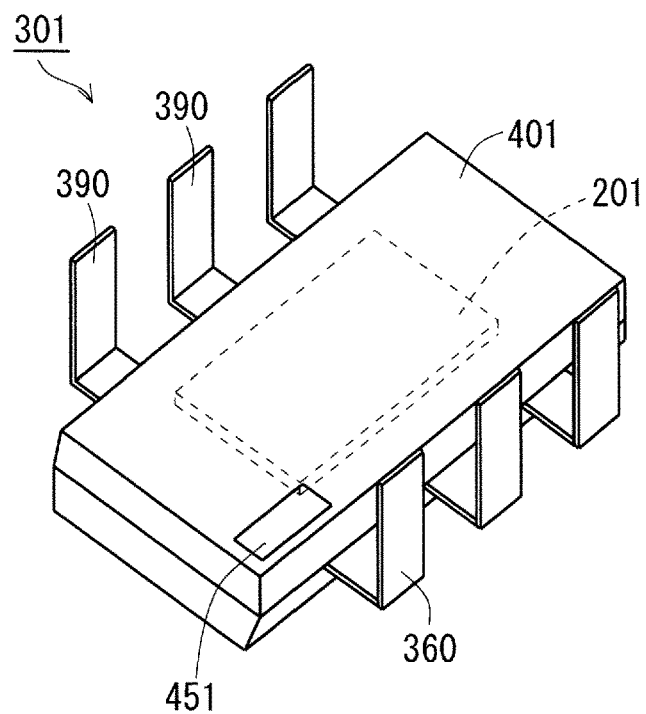
FIG. 1 is a perspective view schematically showing the configuration of a semiconductor device according to a first embodiment of the present invention.

Embodiments according to the present invention will now be described with reference to the drawings. Identical or corresponding parts in the drawings are designated by the same reference numerals and characters, and will not be described repeatedly.

First Embodiment

Referring to FIG. 1, a semiconductor device 301 according to a first embodiment includes an IC chip 201 (one semiconductor chip), a package 401, an information output electrode 360, and element electrodes 390. Typically, the semiconductor device 301 is a power semiconductor device, and further includes a power semiconductor element such as an IGBT (Insulated Gate Bipolar Transistor), a MOSFET (Metal Oxide Semiconductor Field Effect Transistor) or a diode. The IC chip 201 functions as a driving circuit for the power semiconductor element. Each IC chip according to other embodiments to be described later typically functions as a driving circuit for the power semiconductor element as mentioned above, and constitutes a power semiconductor device employing the same.

Figure 2:
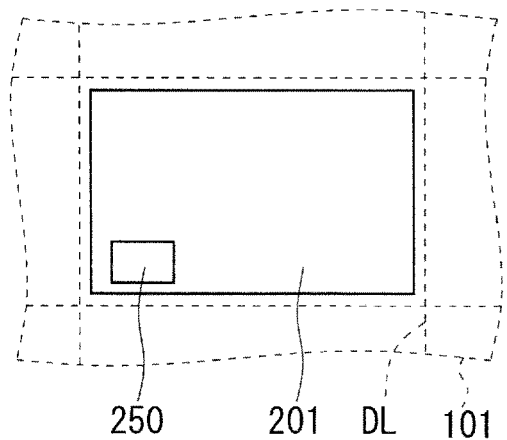
FIG. 2 is a plan view schematically showing the configuration of a semiconductor chip shown in FIG. 1.

Referring to FIG. 2, the IC chip 201 is one in IC chip groups (semiconductor chip groups) manufactured in the step of mass production of IC chips. An IC chip group are, for example, thousands of IC chips or more based on the same specification. Multiple IC chips are manufactured from each wafer 101 in the step of manufacturing the IC chip groups. Specifically, after a semiconductor manufacturing process on each wafer 101, i.e. a wafer process, is performed, the multiple IC chips are cut out of each wafer 101 by dicing along dicing lines DL. Each of the IC chips is assembled in a semiconductor device by an assembly process. For example, the IC chip 201 is assembled in the semiconductor device 301.

The IC chip 201 includes an information recording region 250. Recorded on the information recording region 250 is a first piece of identification information indicating to which group of the mass-produced IC chip groups the IC chip 201 belongs based on a first category. For this purpose, the information recording region 250 has a plurality of fuses selectively blown in accordance with the first piece of identification information. That is, the first piece of identification information is recorded by an electric circuit formed by the selective blowout of the fuses. For example, an information recording scheme using fuses to be described in detail in other embodiments may be applied. The information output electrode 360 is electrically connected to the information recording region 250 of the IC chip 201, and extends to the outside of the package 401.

The package 401 seals the IC chip 201 therein. The package 401 has an information addition region 451 on a surface thereof. Indicated on the information addition region 451 is a second piece of identification information indicating to which group of the IC chip groups the IC chip 201 belongs based on a second category. The second piece of identification information is indicated, for example, using a code such as a bar code or characters.

The IC chip 201 is identifiable from among the IC chip groups by combining the first and second pieces of identification information together. Examples of each of the first and second pieces of identification information used herein include each lot number in a plurality of processes in the manufacture of the semiconductor device 301, a combination of such lot numbers, a chip location number in the wafers 101, and combinations thereof.

For example, the first category includes a chip location in one wafer 101, and a distinction between wafers to be processed in the same wafer process lot, and the second category includes a distinction between wafer process lots repeated for mass production. In this case, the first piece of identification information is a combination of an intra-wafer location information number (WLC) and a wafer number (WN) in the same wafer process lot, and the second piece of identification information is a wafer process lot number (WLN) that is a serial number assigned to each wafer process lot. By combining the first and second pieces of information, the IC chip 201 is identified with which wafer and which wafer process lot. Thus, the IC chip 201 is identified as a unique one in the mass-produced IC chip groups.

At least one of the first and second pieces of identification information may include an item specific to the identification information. Such examples will be described below.

Figure 3:
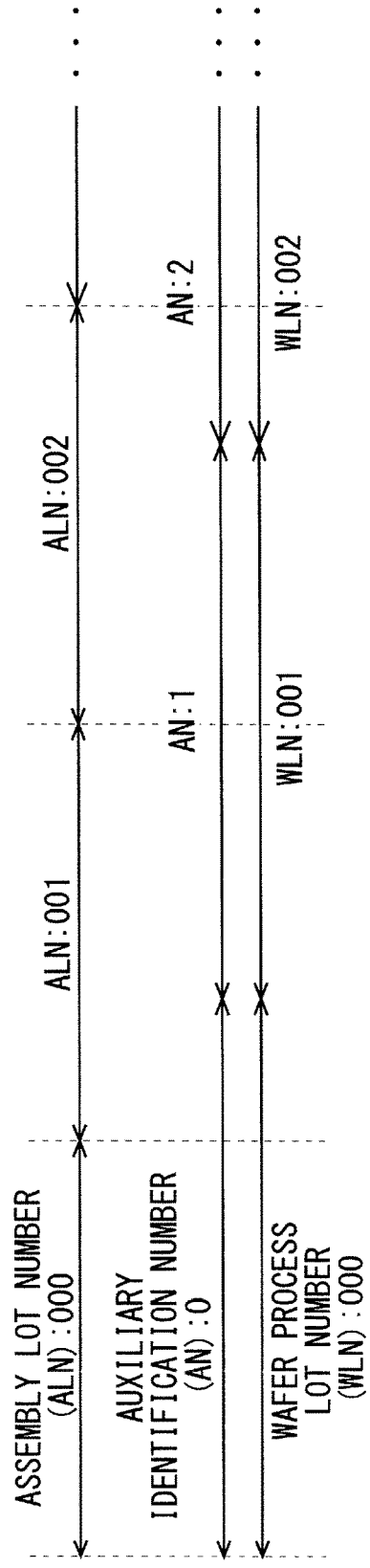
FIG. 3 is a diagram illustrating a first example of a method for setting identification information in the semiconductor device shown in FIG. 1.

In a first example, with reference to FIG. 3, an assembly lot number (ALN) that is a serial number of an assembly process repeated for mass production, and an auxiliary identification number (AN) as an item specific to the identification information are used in place of the aforementioned wafer process lot number (WLN). A correspondence relationship between these numbers is shown in the following table.

TABLE 1

| Wafer process lot number (WLN: ***) | Wafer number (WN: **) | Assembly lot number (ALN: ***) | Auxiliary identification number (AN: *) |
|---|---|---|---|
| 000 | 0-12 | 000 | 0 |
|  |  | 001 |  |
| 001 | 0-12 | 001 | 1 |
|  |  | 002 |  |
| 010 | 0-12 | 010 | 0 |
|  |  | 011 |  |
| 011 | 0-12 | 011 | 1 |
| 012 | 0-12 | 011 | 2 |
| 013 | 0-12 | 012 | 0 |
| 014 | 0-12 | 012 | 1 |
| 015 | 0-12 | 012 | 2 |
| 016 | 0-12 | 013 | 0 |

As shown in FIG. 3 and Table 1, a combination of the assembly lot number (ALN) and the auxiliary identification number (AN) is uniquely brought into correspondence with the wafer process lot number (WLN). In other words, the wafer process lot number (WLN) is identified from the assembly lot number (ALN) and the auxiliary identification number (AN).

Specifically, the auxiliary identification number (AN) is a number determined for each wafer process lot. Unlike the wafer process lot number (WLN), the same auxiliary identification number (AN) is assigned cyclically to different wafer process lots in a duplicate manner. The number of auxiliary identification numbers (AN) shall be a number sufficient to prevent the wafers assigned with the aforementioned same duplicated number from being handled in the same assembly process. That is, the number of auxiliary identification numbers (AN) is determined by the number of wafer process lots in which the wafers handled in the same assembly process are prepared. In this example, the number of auxiliary identification numbers (AN) is three, and the values AN=0, 1 and 2 are repeatedly assigned cyclically to the wafer process lot number (WLN).

Preferably, the auxiliary identification number (AN) is included in the first piece of identification information, and the assembly lot number (ALN) is included in the second piece of identification information. Specifically, the auxiliary identification number (AN) is recorded on the IC chip 201, and the assembly lot number (ALN) is indicated on the package 401. In this case, the first piece of identification information may be determined even at a point in time before the assembly lot number (ALN) corresponding to the IC chip 201 is determined. Thus, the first piece of identification information may be recorded on the IC chip 201 at that point in time. Also, this eliminates the need to manage the auxiliary identification number (AN) that is the information determined for each wafer process lot by other methods until the start time of the assembly process.

In this case, the first piece of identification information to be recorded on the IC chip 201 is a combination of the intra-wafer location information number (WLC), the wafer number (WN) and the auxiliary identification number (AN). The second piece of identification information to be indicated on the package 401 is the assembly lot number (ALN).

In this example, the number of chips processable per lot in the assembly process is less than the number of chips per lot in the wafer process lot. For example, the chips unprocessed in the process having the assembly lot number (ALN):000 among the chips having the wafer process lot number (WLN):000 are processed in a process having the assembly lot number (ALN):001. Subsequently, the chips having the wafer process lot number (WLN):001 are processed. The duplication of the auxiliary identification number (AN) does not occur in the process of the same assembly lot number (ALN).

Figure 4:
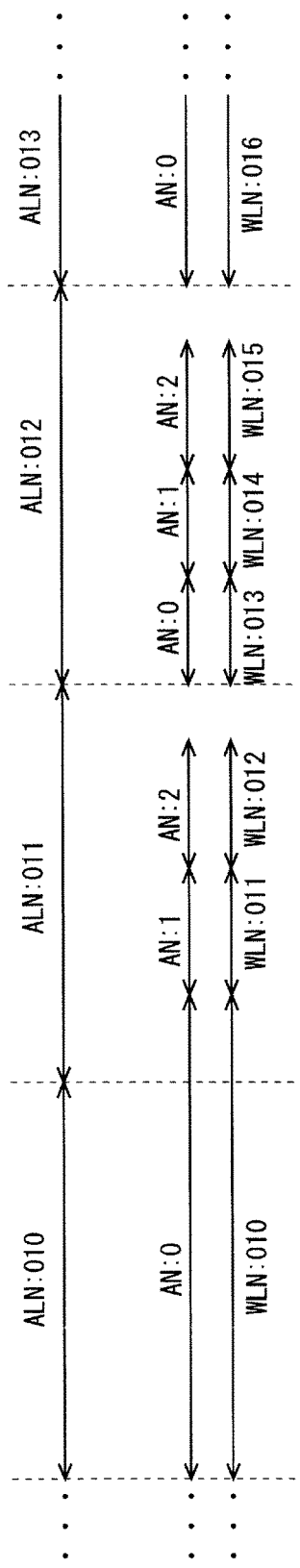
FIG. 4 is a diagram illustrating a second example of the method for setting the identification information in the semiconductor device shown in FIG. 1.

In a second example, with reference to FIG. 4, the number of chips processable per lot in the assembly process is greater than the number of chips per lot in the wafer process lot. Thus, in the this example, the number of wafer process lots supplied for the same assembly lot number (ALN) is limited by the number of simultaneously processable lots in the assembly process for the purpose of preventing the duplication of the auxiliary identification number (AN) in the process of the same assembly lot number (ALN). For example, even when processable from the viewpoint of processing capacity in the process having the assembly lot number (ALN):011, the chips having the wafer process lot number (WLN):013 are processed in the next process having the next assembly lot number (ALN):012 so that the number of simultaneously processable lots is not exceeded. Likewise, the chips having the wafer process lot number (WLN):016 are not processed in the process having the assembly lot number (ALN):012 but is processed in the process having the assembly lot number (ALN):013.

The number of simultaneously processable lots in the assembly process, i.e. the number of auxiliary identification numbers (AN), is determined by the restriction such as the processing capacity of an assembly device, but is obviously smaller than the upper limit of the wafer process lot number (WLN). Thus, the number of fuses required for the information recording region 250 of the IC chip 201 is reduced by adding the auxiliary identification number (AN) in place of the wafer process lot number (WLN) into the IC chip 201. For example, when the values of 000 to 999, i.e. three-digit numbers, are used as the wafer process lot number (WLN), if the value were represented by fuses, 10 fuses capable of representing 10-bit information would be required. In this example, however, three types of auxiliary identification numbers (AN) instead of the wafer process lot number (WLN) are expressed by fuses. Thus, two fuses capable of representing 2-bit information are sufficient. Thus, the number of fuses required for the recording of information is reduced by eight.

Figure 5:
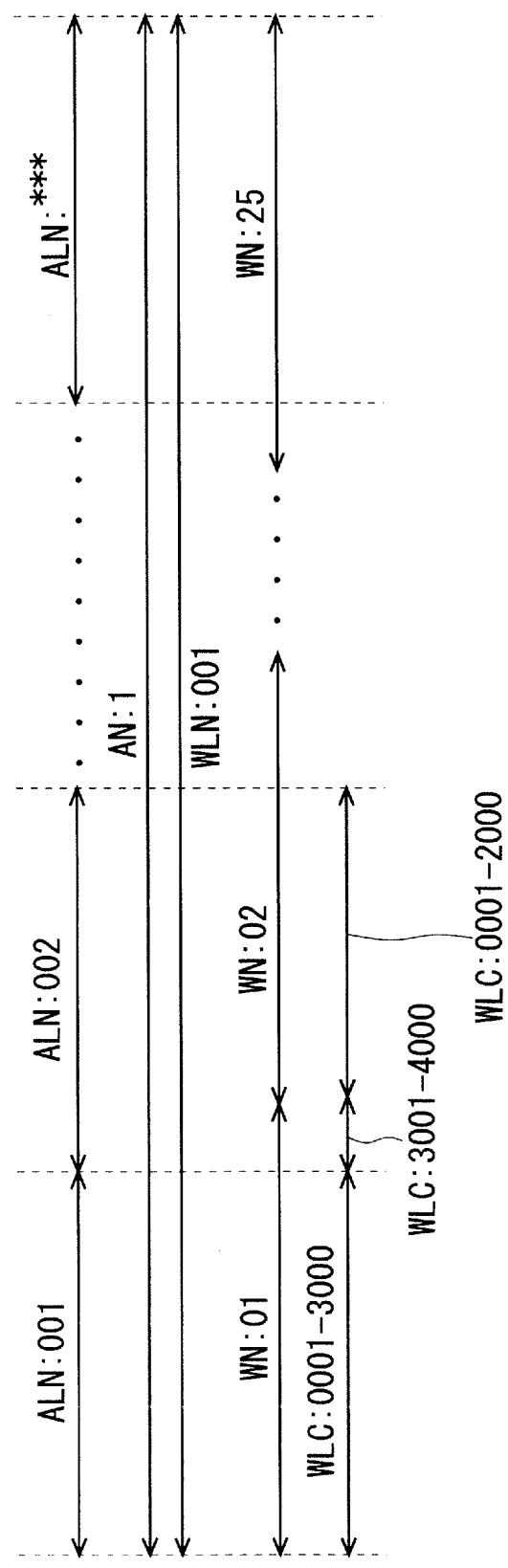
FIG. 5 is a diagram illustrating a third example of the method for setting the identification information in the semiconductor device shown in FIG. 1.

In a third example, with reference to FIG. 5, manufacturing conditions which prevent the duplication of the intra-wafer location information number (WLC) in the same assembly lot number (ALN) are used, and the wafer number (WN) is omitted from the first piece of identification information for the purpose of reducing the amount of information. Such manufacturing conditions correspond to an instance in which the number of chips per wafer is greater than the number of simultaneously processable chips per lot in the assembly process. For example, an instance in which the number of simultaneously processable chips per lot in the assembly process is 3000 and the number of chips per wafer is 4000 is shown in the following table.

TABLE 2

| Wafer process lot number (WLN: ***) | Wafer number (WN: ***) | Intra-wafer location information number (WLC: ****) | Assembly lot number (ALN: ***) | Auxiliary identification number (AN: *) |
| --- | --- | --- | --- | --- |
| 001 | 01 | 0001-3000 | 001 | 1 |
|  |  | 3001-4000 | 002 |  |
|  | 02 | 0001-2000 |  |  |
|  |  | 2001-4000 | 003 |  |

As indicated above, the duplication of the intra-wafer location information number (WLC) in the assembly lot number (ALN) does not occur. In this case, the wafer number (WN) is not required. This is because the wafer number (WN) is identifiable from the auxiliary identification number (AN) and the assembly lot number (ALN).

According to the present embodiment, the pieces of identification information for ensuring the traceability of the IC chip 201 are recorded separately on the IC chip 201 and the package 401 for sealing the IC chip 201. This eliminates the need to indicate all pieces of identification information on the package 401 to reduce the restriction on the outside shape design of the package 401. Also, there is no need to record all pieces of identification information on the IC chip 201, which in turn reduces the information recording burden on the IC chip 201. This reduces the number of fuses required for the recording on the information recording region 250 of the IC chip, and reduces the area of the information recording region 250.

Also, the information output electrode 360 is capable of acquiring the first piece of identification information on the IC chip 201 from the information recording region 250 of the IC chip 201 sealed in the package 401.

The instance in which the semiconductor device 301 includes the one IC chip 201 is described in the first embodiment. However, the semiconductor device may include not less than two IC chips. The number of information output electrodes 360 is not limited to one, but may be determined, as required. The aforementioned pieces of information may be represented by a set of numerals or information containing a letter and a mark in place of numbers. For example, the intra-wafer location information (WLC) is not limited to consecutive numbers designating the location in a wafer, but may be a combination of coordinate values.

Second Embodiment

Referring to FIG. 6, an IC chip 202 according to the present embodiment is one in IC chip groups manufactured in the step of mass production of IC chips. An IC chip group includes, for example, thousands of IC chips or more based on the same specification. The IC chip 202 includes a composite recording region 260. The composite recording region 260 includes a first partial recording region 261 and a second partial recording region 262. Recorded on the first partial recording region 261 is the first piece of identification information indicating to which group of the IC chip groups the IC chip 202 belongs based on the first category. The first partial recording region 261 has a plurality of fuses selectively blown in accordance with the first piece of identification information. Recorded on the second partial recording region 262 is the second piece of identification information indicating to which group of the IC chip groups the IC chip 202 belongs based on the second category. The second partial recording region 262 has a circuit pattern patterned in accordance with the second piece of identification information. The IC chip 202 is identifiable from among the IC chip groups by combining the first and second pieces of identification information together.

Referring to FIG. 7, each of the IC chip group is assembled in a semiconductor device by the assembly process. In other words, the IC chip 202 is assembled in a semiconductor device 302. At this time, the IC chip 202 is sealed by a package 402. Unlike the package 401 (FIG. 1), the package 402 does not has the information addition region 451.

Referring to FIG. 8, multiple IC chips are manufactured from each wafer 102 in the step of manufacturing the IC chip groups. Specifically, after a semiconductor manufacturing process on each wafer 102, i.e. a wafer process, is performed, the multiple IC chips are cut out of each wafer 102 by dicing along the dicing lines DL. The wafer process includes a photolithographic process in which projection exposure with a shot region ST used as a unit is performed a plurality of times by means of a stepper device to transfer a mask pattern to each wafer 102.

Referring to FIG. 9, parts which become IC chips 202a to 202h (collectively referred to also as the IC chip 202 as mentioned above) are formed in each shot region ST. The IC chips 202a to 202h include respective second partial recording regions 262a to 262h (collectively referred to also as the second partial recording region 262 as mentioned above). The second partial recording regions 262a to 262h have circuit patterns different from each other, which are transferred from the mask pattern. Recorded on these circuit patterns is intra-shot location information (SLC) indicating the location in each shot region ST. Recorded on the first partial recording region 261 of each of the IC chips 202a to 202h are the wafer process lot number (WLN), the wafer number (WN) and a shot number (SN) in corresponding relation to the first piece of identification information by selective blowout of the fuses. The shot number (SN) is a number for identifying the shot regions ST in one wafer 102.

Figure 10:
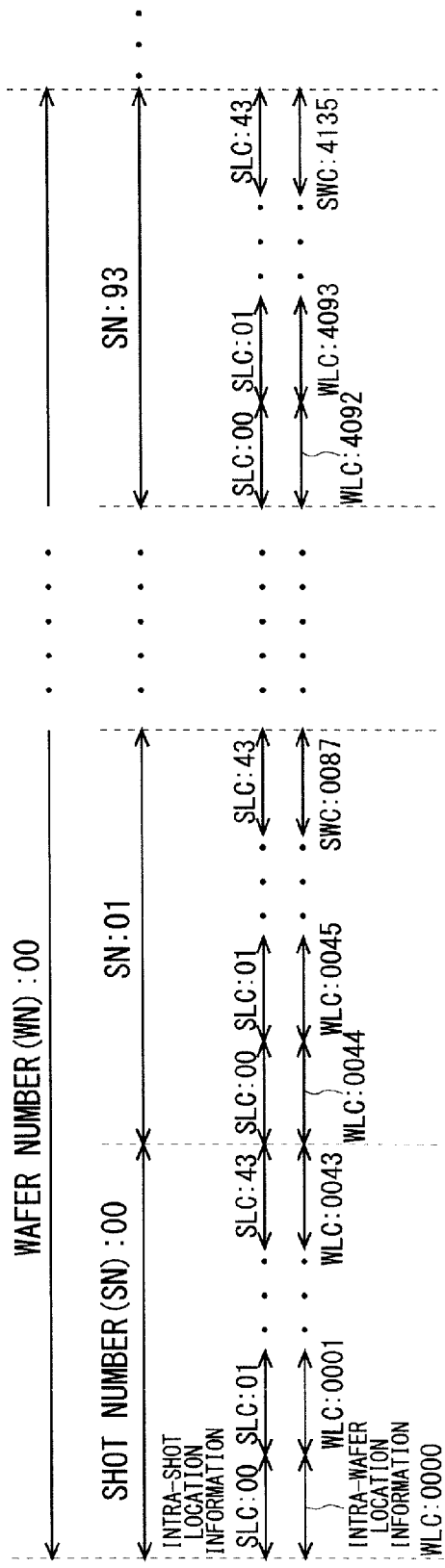
FIG. 10 is a diagram illustrating an example of the method for setting the identification information in the semiconductor chip shown in FIG. 6.

Referring to FIG. 10, the shot regions ST assigned with the shot number (SN) are formed in each wafer 102 assigned with the wafer number (WN). The IC chips 202a to 202h assigned with the intra-shot location information (SLC) are formed in each of the shot regions ST. The intra-wafer location information (WLC) is identifiable by combining the shot number (SN) and the intra-shot location information (SLC). This eliminates the need to record the intra-wafer location information (WLC) itself. An example of such a combination is shown in the following table.

TABLE 3

| Intra-wafer location information (WLC: ****) | Shot number (SN: **) | Intra-shot location information (SLC: **) |
|---|---|---|
| 0000 | 00 | 0 |
| 0001 |  | 1 |
| ... |  | ... |
| 0043 |  | 43 |
| 0044 | 01 | 0 |
| 0045 |  | 1 |
| ... |  | ... |
| 0087 |  | 43 |

TABLE 3-continued

| Intra-wafer location information (WLC: ****) | Shot number (SN: **) | Intra-shot location information (SLC: **) |
|---|---|---|
| ... | ... | ... |
| 4092 | 93 | 0 |
| 4093 |  | 1 |
| ... |  | ... |
| 4135 |  | 43 |

Components other than those described above are substantially similar to those of the aforementioned first embodiment. Identical or corresponding elements are designated by the same reference numerals and characters, and will not be described repeatedly.

According to the present embodiment, the pieces of identification information for ensuring the traceability of the IC chip 202 are recorded in a shared manner on the fuses and the circuit pattern. This reduces the number of fuses required for the recording of the identification information to thereby reduce the information recording burden on the semiconductor chip. Specifically, the intra-shot location information (SLC) is recorded as the circuit pattern, so that the shot number (SN) smaller in the amount of information than the intra-wafer location information (WLC) is sufficiently used as the information to be recorded on the fuses. In particular, when there are a large number of chips per wafer because of the use of a large wafer 102, the intra-wafer location information (WLC) is accordingly large in amounts, so that the information to be recorded on the fuses is reduced very effectively. For example, as shown in FIG. 10 and Table 3, when the number of shots is 94 and the number of chips in a shot is 44, the number of chips in a wafer is 4136 which is the product of the number of shots and the number of chips in a shot, so that fuses equivalent to 13 bits are required for the recording of the intra-wafer location information (WLC). On the other hand, when the intra-shot location information (SLC) is added using the mask pattern, only fuses equivalent to 7 bits for the shot number (SN) is required. Thus, the number of fuses is reduced by six.

Third Embodiment

Figure 11:
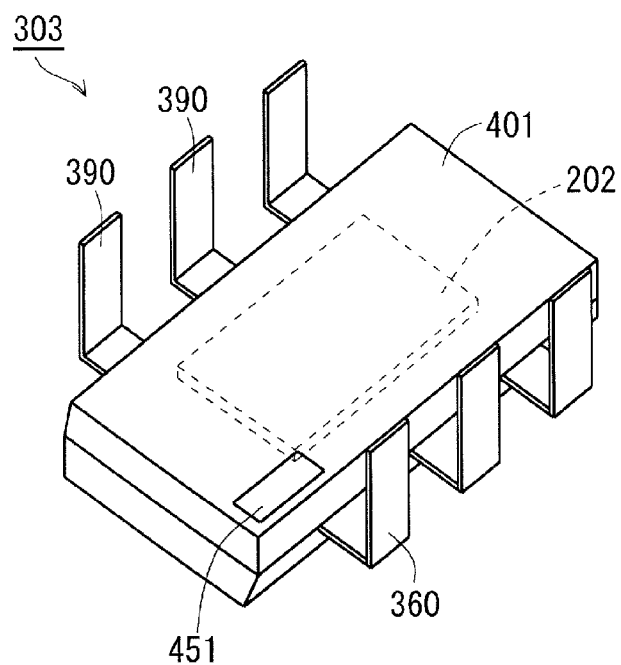
FIG. 11 is a perspective view schematically showing the configuration of the semiconductor device according to a third embodiment of the present invention.

Referring to FIG. 11, a semiconductor device 303 according to the present embodiment includes the IC chip 202 (FIG. 6) in place of the IC chip 201 (FIG. 1). The composite recording region 260 (FIG. 6) included in the IC chip 202 has a circuit pattern in accordance with the first piece of identification information described in the first embodiment in the second partial recording region 262. The first piece of identification information described in the first embodiment is recorded in a shared manner on this circuit pattern and the fuses in the first partial recording region 261.

Components other than those described above are substantially similar to those of the aforementioned first embodiment. Identical or corresponding elements are designated by the same reference numerals and characters, and will not be described repeatedly.

According to the present embodiment, the first piece of identification information is recorded in a shared manner on the fuses and the circuit pattern. This reduces the number of fuses required for the recording of the first piece of identification information to thereby reduce the information recording burden on the IC chip 202.

The effects of both of the aforementioned first and second embodiments are produced by the present embodiment.

With reference to the aforementioned examples, the present embodiment is capable of reducing the lot identification information by the amount of 8 bits as in the first embodiment, and is capable of reducing the chip identification information by the amount of 6 bits as in the second embodiment. Thus, the present embodiment achieves the reduction in the amount of information by a total of 14 bits. As a result, the number of fuses required for the recording is reduced by 14.

Fourth Embodiment

Figure 12:
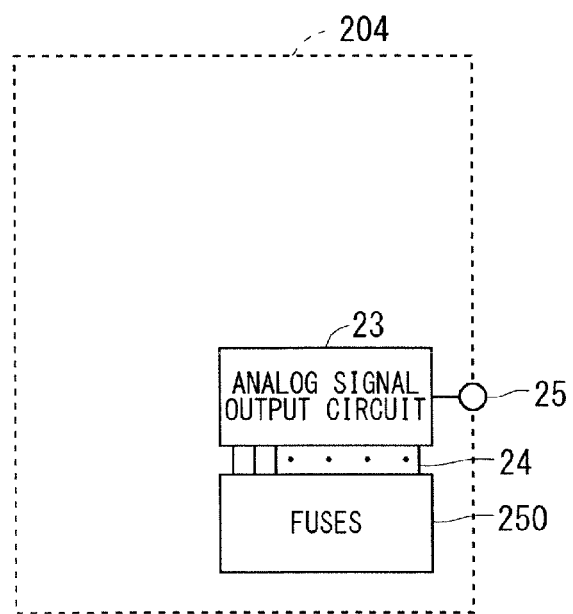
FIG. 12 is a block diagram schematically showing the configuration of the semiconductor chip according to a fourth embodiment of the present invention.

Referring to FIG. 12, an IC chip 204 (semiconductor chip) according to the present embodiment includes an analog signal output circuit 23 and an output terminal 25. The output terminal 25 is electrically connected to the information recording region 250 (FIG. 2). The analog signal output circuit 23 is connected through aluminum interconnect lines 24 to the information recording region 250, and outputs an analog output corresponding to the information recording region 250 from the output terminal 25.

Components other than those described above are substantially similar to those of the IC chip 201 (first embodiment) or the semiconductor device 301 including the IC chip 201. Identical or corresponding elements are designated by the same reference numerals and characters, and will not be described repeatedly.

According to the present embodiment, information is electrically acquired from the information recording region of the IC chip 204. Also, the information recorded on the information recording region 250 of the IC chip 204 is acquired by measurement made on the analog output. Specifically, the pieces of identification information are distinguishable by comparing the outputted analog signal with an analog value previously set for each of the pieces of identification information.

The composite recording region 260 (FIG. 6) may be provided in place of the information recording region 250. In other words, the technique of the present embodiment may be applied to the second or third embodiment. In this case, the output terminal 25 is capable of outputting an analog signal corresponding to at least one of the selective blowout of the fuses in the first partial recording region 261 and the circuit pattern in the second partial recording region 262. The same applies to fifth to ninth embodiments to be described below.

Fifth Embodiment

Figure 13:
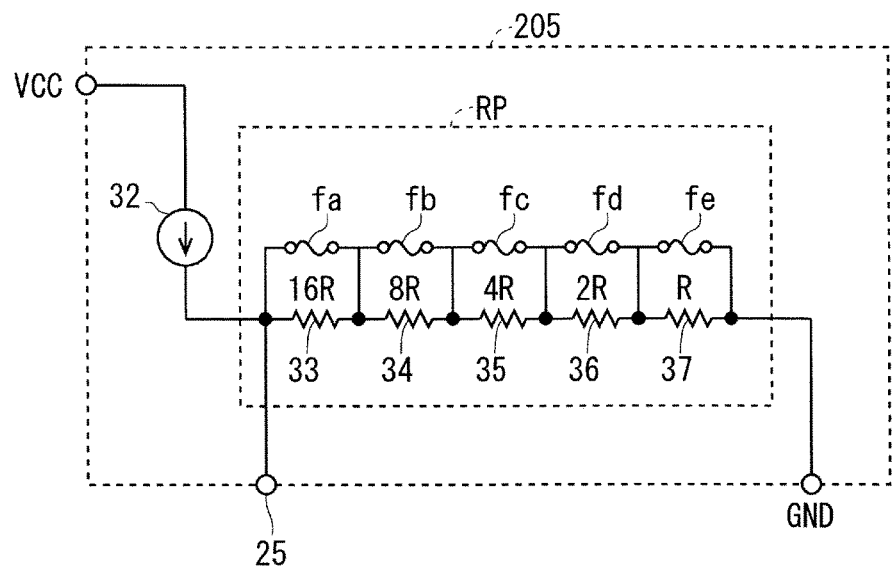
FIG. 13 is a circuit diagram schematically showing the configuration of the semiconductor chip according to a fifth embodiment of the present invention.

Referring to FIG. 13, an IC chip 205 (semiconductor chip) according to the present embodiment includes an analog voltage output circuit serving as the analog signal output circuit 23 (FIG. 12) in the fourth embodiment. That is, a voltage signal is used in the fifth embodiment as the analog signal in the fourth embodiment.

Specifically, the IC chip 205 includes a constant current source 32 and a resistive part RP. The resistive part RP has a first end connected to the constant current source 32 and the output terminal 25, and a second end grounded. The resistive part RP includes resistive elements 33 to 37 and fuses fa to fe. The resistive elements 33 to 37 are connected in series with each other. The fuses fa to fe are connected in parallel with the resistive elements 33 to 37, respectively. The resistive elements 33 to 37 are weighted with respective resistance values R to 16R based on a value R as a unit, for example, as shown.

Selectively cutting the fuses fa to fe changes a combination of the resistive elements 33 to 37 substantially functioning in the resistive part RP connected to the constant current source 32 to allow a desired analog voltage to be outputted from the output terminal 25. The pieces of identification information are distinguishable by comparing the analog voltage acquired at the output terminal 25 with a voltage value previously set for each of the pieces of identification information. For precise distinguishment, it is necessary to output the analog voltage corresponding to the identification information with high accuracy. To this end, the accuracy of a constant current value may be improved by laser beam machining of the constant current source 32 to thereby improve the accuracy of the output voltage.

The circuit for outputting the analog voltage is not limited to that having the aforementioned configuration. For example, while the resistive part RP does not include the fuses but has a fixed resistance value, the fuses provided in respective constant current sources which cause current to flow into the resistive part RP may be selectively cut.

Components other than those described above are substantially similar to those of the aforementioned fourth embodiment. Identical or corresponding elements are designated by the same reference numerals and characters, and will not be described repeatedly.

Sixth Embodiment

Figure 14:
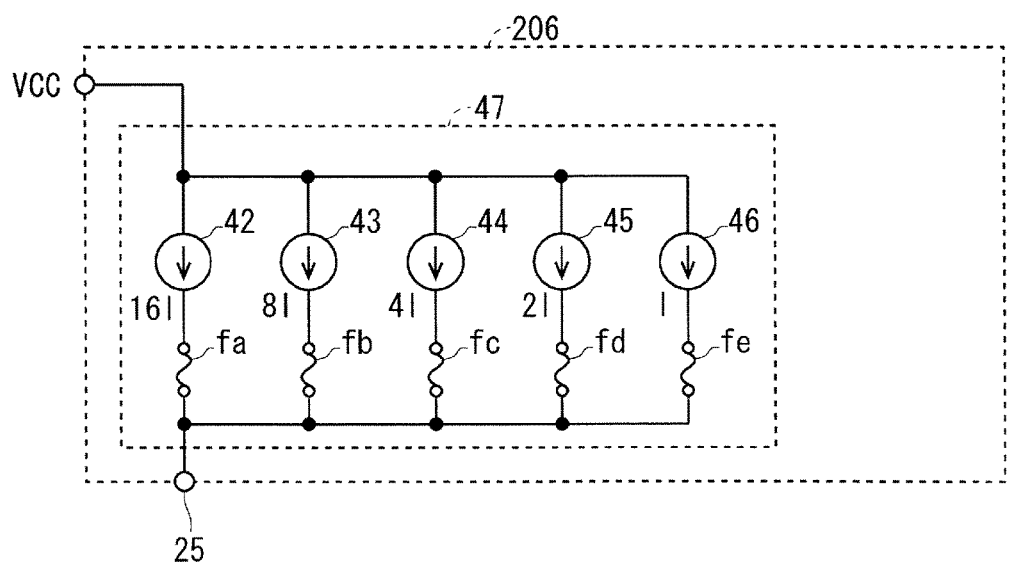
FIG. 14 is a circuit diagram schematically showing the configuration of the semiconductor chip according to a sixth embodiment of the present invention.

Referring to FIG. 14, an IC chip 206 (semiconductor chip) according to the present embodiment includes an analog current output circuit serving as the analog signal output circuit 23 (FIG. 12) in the fourth embodiment. That is, a current signal is used in the present embodiment as the analog signal in the fourth embodiment.

Specifically, the IC chip 206 includes constant current sources 42 to 46 and the fuses fa to fe. The constant current sources 42 to 46 are connected in series with the fuses fa to fe, respectively. These in-series structures are connected in parallel with each other. The constant current sources 42 to 46 are weighted with respective current values I to 16I based on a value I as a unit, for example, as shown. The aforementioned components constitute a variable current source 47 which outputs a current in accordance with the pieces of identification information.

Selectively cutting the fuses fa to fe changes a combination of the constant current sources 42 to 46 connected to the output terminal 25 to allow a desired analog current to be outputted. For the purpose of distinguishing between the pieces of identification information more precisely, the accuracy of the constant current source values may be improved by laser beam machining of the constant current sources 42 to 46 as in the fifth embodiment to thereby improve the accuracy of the output current.

Figure 15:
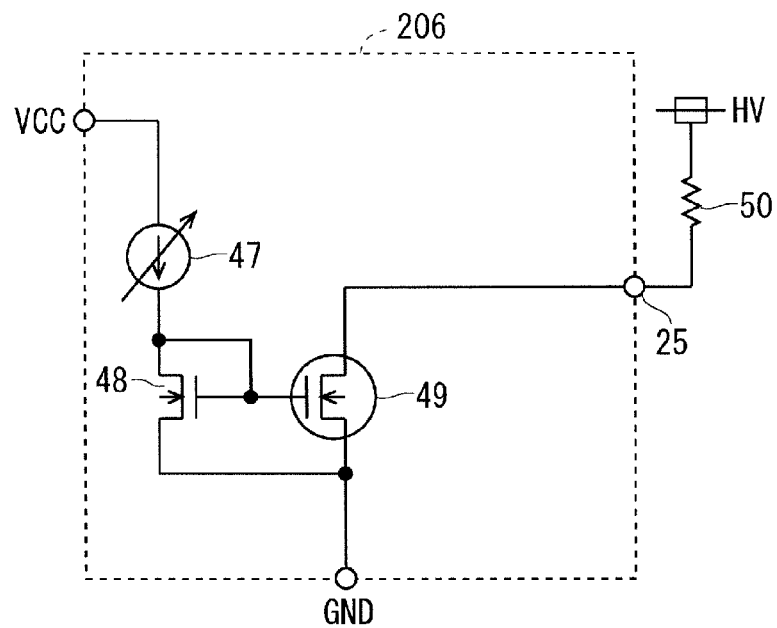
FIG. 15 is a circuit diagram schematically showing a modification of FIG. 14.

Referring to FIG. 15, a high-breakdown-voltage MOSFET (Metal Oxide Semiconductor Field Effect Transistor) may be used for the analog current output circuit to ensure a large output width per 1 bit of information, thereby distinguishing between the pieces of identification information more precisely. Specifically, a current mirror circuit comprised of an n-type MOSFET 48 and a high-breakdown-voltage n-type MOSFET 49 is connected to the variable current source 47. A resistive element 50 is connected on the outside to the output terminal 25, and a high voltage HV is applied to the output terminal 25, so that the current outputted from the variable current source 47 is amplified and outputted. This achieves the distinguishment between the pieces of identification information more precisely without any high-accuracy measuring device.

Components other than those described above are substantially similar to those of the aforementioned fourth embodiment. Identical or corresponding elements are designated by the same reference numerals and characters, and will not be described repeatedly.

Seventh Embodiment

Figure 16:
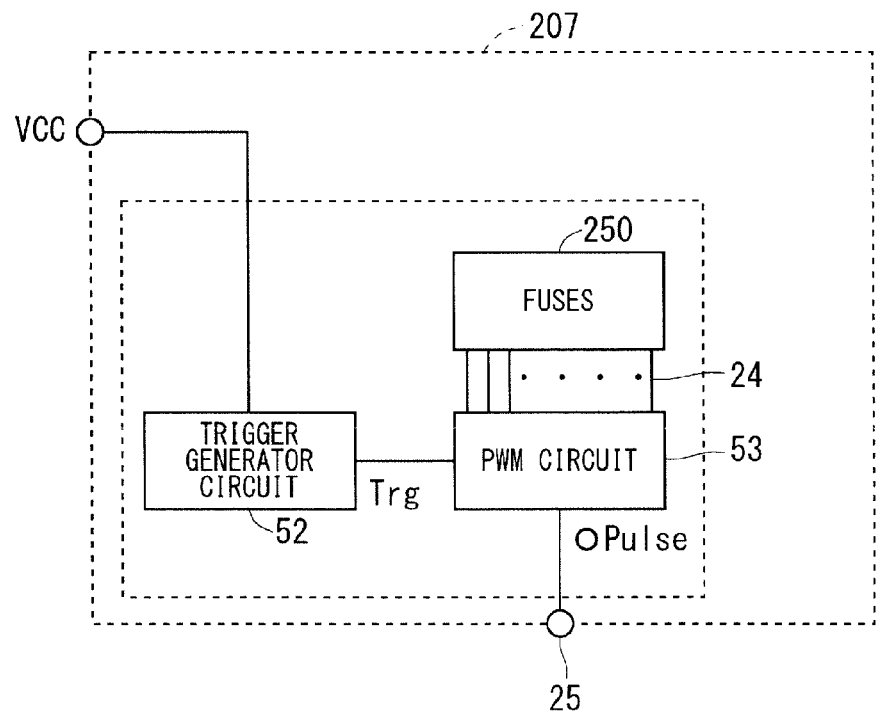
FIG. 16 is a block diagram schematically showing the configuration of the semiconductor chip according to a seventh embodiment of the present invention.

Referring to FIG. 16, an IC chip 207 (semiconductor chip) according to the present embodiment includes a pulse signal output circuit serving as the analog signal output circuit 23 (FIG. 12) in the fourth embodiment. That is, a pulse signal is used in the present embodiment as the analog signal in the fourth embodiment.

Specifically, the IC chip 207 includes a trigger generator circuit 52 and a PWM (Pulse Width Modulation) circuit 53 to output a pulse having a desired width at the time of trigger generation. The trigger generator circuit 52 is a circuit for generating a trigger in synchronism with the rising edge of an inputted power supply voltage VCC to output a desired pulse.

Figure 17:
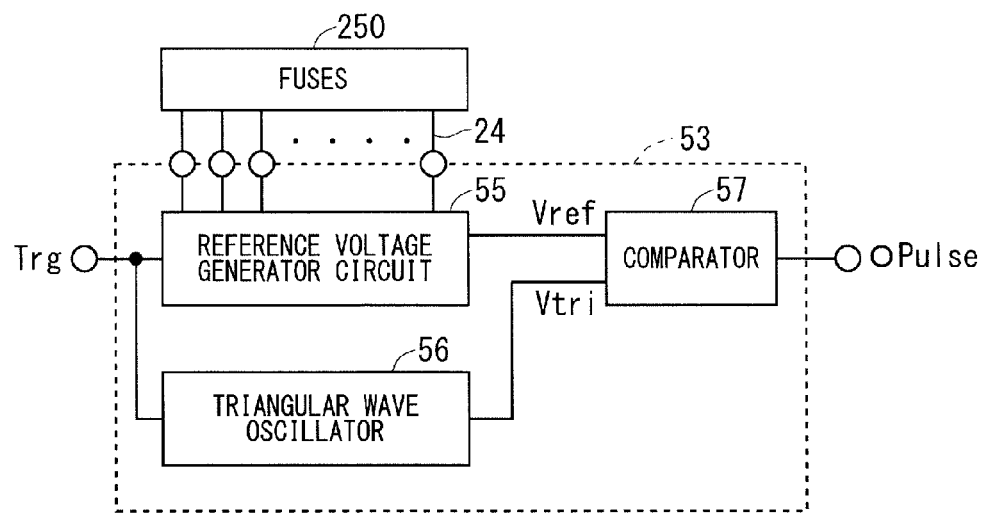
FIG. 17 is a block diagram schematically showing the configuration of a PWM circuit shown in FIG. 16.

Referring to FIG. 17, the PWM circuit 53 includes a reference voltage generator circuit 55, a triangular wave oscillator 56, and a comparator 57. The reference voltage generator circuit 55 is a circuit for generating a reference voltage in accordance with the cutting situation of the fuses in the information recording region 250 to input the reference voltage to the comparator 57 in synchronism with the falling edge of a trigger signal Trg. The triangular wave oscillator 56 is a circuit for starting to generate a triangular wave in synchronism with the falling edge of the trigger signal Trg. The comparator 57 makes a comparison between the reference voltage received from the reference voltage generator circuit 55 and the triangular wave received from the triangular wave oscillator 56 to thereby output a pulse OPulse having a desired width.

Figure 18:
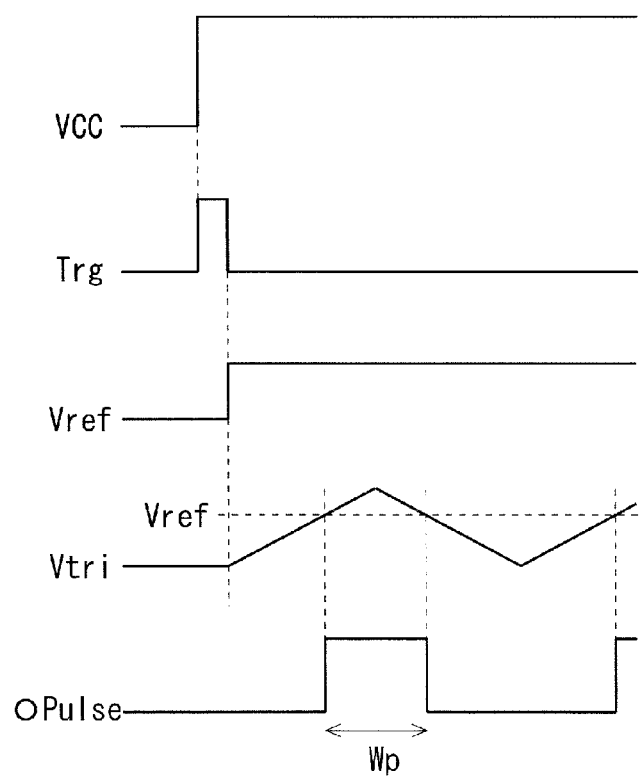
FIG. 18 is a timing diagram of a pulse signal and signals for the generation of the pulse signal in the semiconductor chip shown in FIG. 16.

FIG. 18 is a timing diagram in the case where the circuits of FIGS. 16 and 17 are used to generate a desired pulse. The trigger signal Trg rises in synchronism with the rising edge of the power supply voltage VCC, and a reference voltage Vref and a triangular wave Vtri are generated in synchronism with the falling edge of the trigger signal Trg, so that the pulse OPulse having a desired width Wp is generated.

An instance in which the trigger signal Trg is generated using the power supply voltage VCC is illustrated above. However, any method may be used to generate the trigger signal Trg. For example, a trigger may be generated using an input signal or other signals in the circuit. Alternatively, the trigger signal Trg may be inputted from the outside. The reference voltage Vref and the triangular wave Vtri are generated steadily after the fall of the trigger signal Trg in the aforementioned instance, but may be generated only for a time period over which the trigger signal Trg is high. Although the PWM circuit using the triangular wave is illustrated in the aforementioned instance, another circuit which generates a desired pulse through the use of a constant current source and a capacitor may be used.

Components other than those described above are substantially similar to those of the aforementioned fourth embodiment. Identical or corresponding elements are designated by the same reference numerals and characters, and will not be described repeatedly.

Eighth Embodiment

Figure 19:
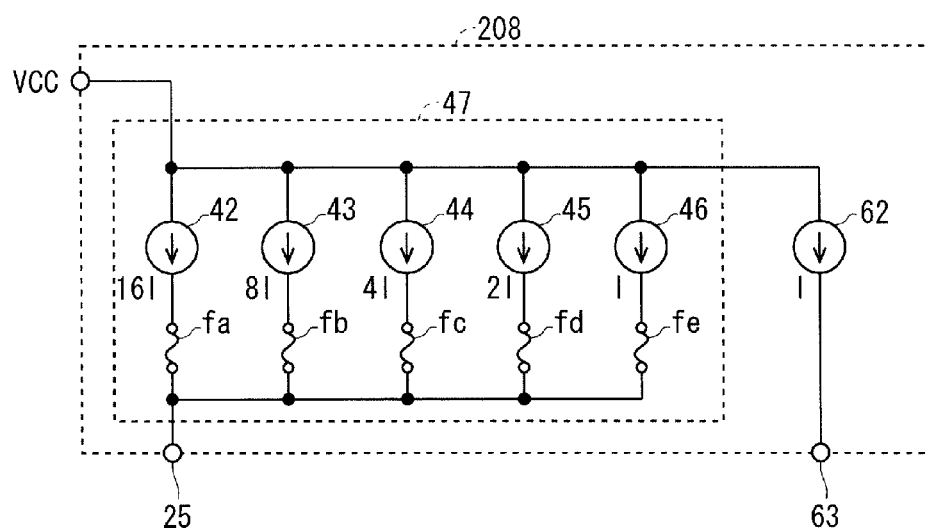
FIG. 19 is a circuit diagram schematically showing the configuration of the semiconductor chip according to an eighth embodiment of the present invention.

Referring to FIG. 19, an analog output circuit in an IC chip 208 (semiconductor chip) according to the present embodiment outputs a reference signal serving as a comparison criterion for an analog signal. Specifically, the analog output circuit outputs a reference current serving as a comparison criterion for an analog current signal. As in the aforementioned sixth embodiment, the distinguishment between the pieces of identification information is achieved by making a comparison between a current value serving as an outputted analog signal and a value previously set for each piece of identification information. According to the present embodiment, the distinguishment between the pieces of identification information is achieved more precisely by making a comparison between the internally generated reference current and a current corresponding to each piece of identification information.

To this end, the analog current output circuit in the IC chip 208 includes a referenced constant current source 62 and a reference output terminal 63. A comparison is made between the analog signal corresponding to the piece of identification information outputted from the output terminal 25 and the reference signal outputted from the reference output terminal 63, so that the piece of identification information is acquired as a ratio with respect to the reference signal. This achieves the distinguishment between the pieces of identification information more precisely. The current value of the referenced constant current source 62 in the figure is equal to the current value of the constant current source 46 which outputs the current of the least significant bit, but may be any current value.

Components other than those described above are substantially similar to those of the aforementioned sixth embodiment. Identical or corresponding elements are designated by the same reference numerals and characters, and will not be described repeatedly. An instance in which the analog signal is a current is illustrated in the present embodiment. However, even in the cases where the analog signal is a voltage signal (fifth embodiment) and a pulse signal (seventh embodiment), the analog output circuit outputs the reference signal to improve the accuracy of information reading.

Ninth Embodiment

Figure 20:
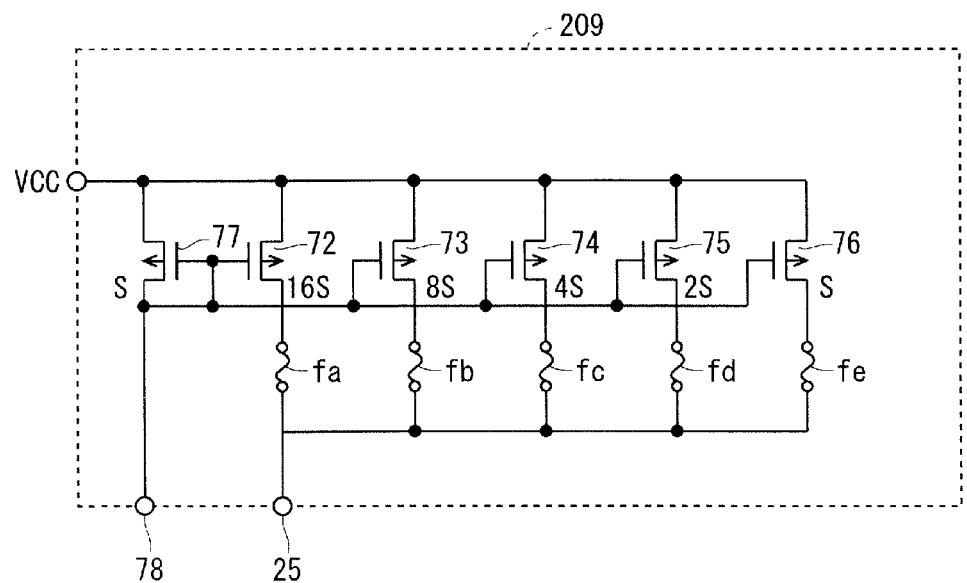
FIG. 20 is a circuit diagram schematically showing the configuration of the semiconductor chip according to a ninth embodiment of the present invention.

Referring to FIG. 20, an analog output circuit in an IC chip 209 (semiconductor chip) according to the present embodiment receives a reference signal serving as a comparison criterion for an analog signal from the outside. Based on this reference signal, the analog output circuit generates an output signal. This improves the accuracy of information reading from the analog signal. Also, a user may input any reference signal to adjust the magnitude of the analog signal to be measured, as required.

To this end, the analog current output circuit in the IC chip 209 includes the fuses fa to fe similar to those of the sixth embodiment, p-type MOSFETs 72 to 77, the output terminal 25, and a reference input terminal 78. The p-type MOSFETs 72 to 76 are equivalent to the constant current sources 42 to 46 in the sixth embodiment. The p-type MOSFETs 72 to 76 are weighted with respective sizes S to 16S based on the size S of a p-type MOSFET as a reference, for example, as shown. A constant current source is formed by a current mirror circuit, and a current mirror is used for the reference current inputted from the reference input terminal 78, so that a current output corresponding to the piece of identification information is generated based on the reference current. A comparison is made between the current value inputted to the reference input terminal 78 and the current value outputted from the output terminal 25, so that the piece of identification information is acquired as a ratio with respect to the reference signal. This achieves the distinguishment between the pieces of identification information more precisely.

In the aforementioned configuration, the size S of the p-type MOSFET 77 is equal to that of the p-type MOSFET 76 which outputs the current of the least significant bit, but may be any size.

Components other than those described above are substantially similar to those of the aforementioned sixth embodiment. Identical or corresponding elements are designated by the same reference numerals and characters, and will not be described repeatedly. An instance in which the analog signal is a current is illustrated in the present embodiment. However, even in the cases where the analog signal is a voltage signal (fifth embodiment) and a pulse signal (seventh embodiment), the analog output circuit receives the reference signal to improve the accuracy of information reading.

Tenth Embodiment

Figure 21:
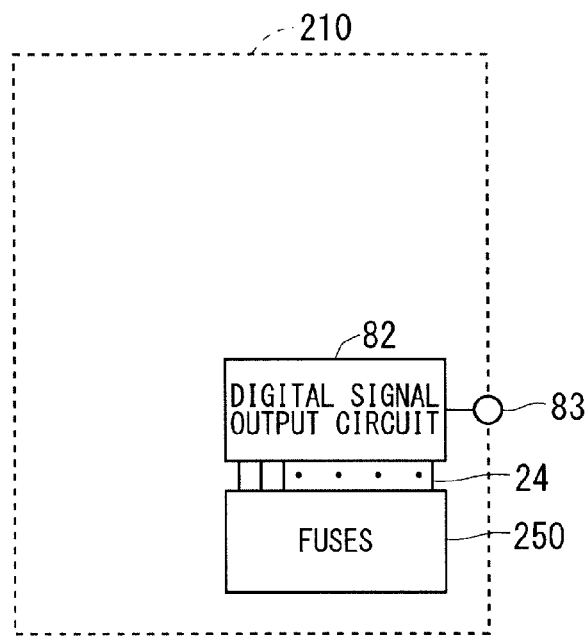
FIG. 21 is a block diagram schematically showing the configuration of the semiconductor chip according to a tenth embodiment of the present invention.

Referring to FIG. 21, an IC chip 210 (semiconductor chip) according to the present embodiment includes a digital signal output circuit 82 and an output terminal 83. The output terminal 83 is electrically connected through the digital signal output circuit 82 to the information recording region 250 (FIG. 2). The digital signal output circuit 82 is connected through the aluminum interconnect lines 24 to the information recording region 250, and outputs a digital output corresponding to the information recording region 250 from the output terminal 25. In particular, when the use of the analog signal makes it difficult to distinguish between the pieces of identification information because of a large amount of information, the pieces of identification information are acquired precisely by providing an output in the form of a digital signal.

Figure 22:
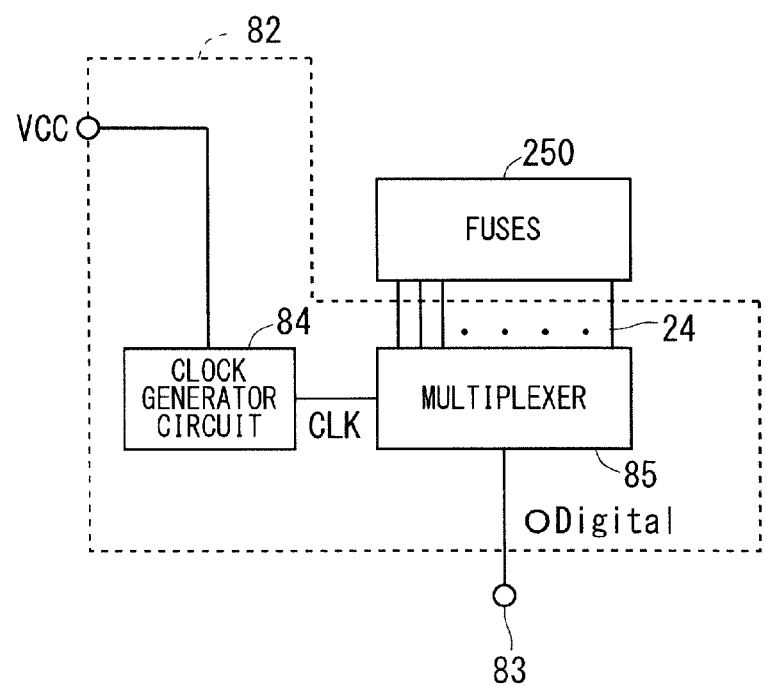
FIG. 22 is a block diagram schematically showing the configuration of a digital signal output circuit shown in FIG. 21.

Referring to FIG. 22, the digital signal output circuit 82 includes a clock generator circuit 84 and a multiplexer 85. The clock generator circuit 84 is a circuit for generating a clock signal in synchronism with the rising edge of the power supply voltage VCC inputted thereto. In the digital signal output circuit 82, the multiplexer 85 outputs binary information corresponding to the selective cutting situation of the fuses provided in the information recording region 250 in synchronism with a clock signal CLK generated by the clock generator circuit 84.

Figure 23:
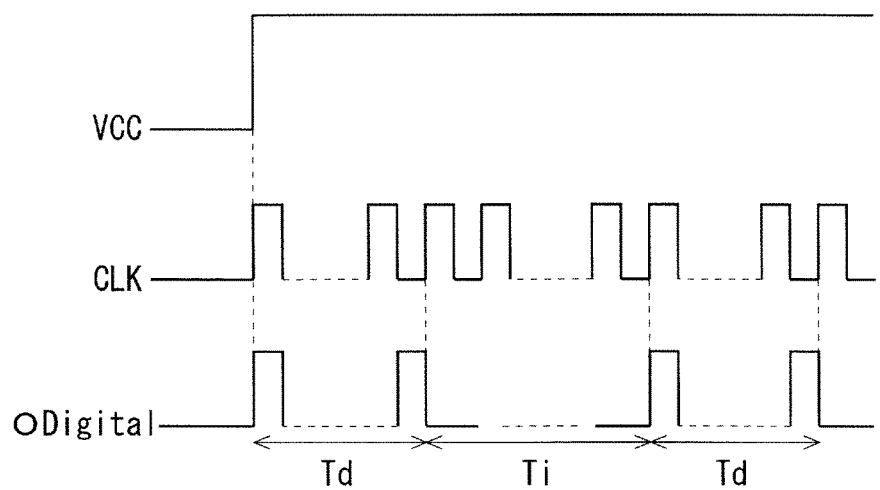
FIG. 23 is a timing diagram of a pulse signal and signals for the generation of the pulse signal in the semiconductor chip shown in FIG. 21.

FIG. 23 is a timing diagram in the case where the circuits of FIGS. 21 and 22 are used to generate a desired pulse. The identification information is outputted as a digital signal in synchronism with the rising edge of the power supply voltage VCC. For example, a digital signal output ODigital includes identification information output time periods Td over which the identification information is outputted and an interval time period Ti. Setting the interval time period Ti sufficiently long relative to the identification information output time periods Td achieves the output of the identification information composed of any combination of pieces of information. In other words, the multiplexer 85 outputs unit information over each of the identification information output time periods Td, so that the pieces of identification information are acquired in succession.

The clock signal CLK is generated in synchronism with the rising edge of the power supply voltage VCC in the aforementioned instance. However, any method may be used to generate the clock signal CLK. For example, the clock signal CLK may be generated in synchronism with other signals in the IC circuit or inputted from the outside. In FIG. 22, the multiplexer 85 is used to output the pieces of identification information in succession. However, the digital output may be provided in any form. For example, generally known serial bus standards such as SPI (Serial Peripheral Interface) and I2C (Inter-Integrated Circuit) may be used to output the pieces of identification information. Alternatively, parallel communication may be used to output the pieces of identification information.

Components other than those described above are substantially similar to those of the IC chip 201 (first embodiment) or the semiconductor device 301 including the IC chip 201. Identical or corresponding elements are designated by the same reference numerals and characters, and will not be described repeatedly.

The composite recording region 260 (FIG. 6) may be provided in place of the information recording region 250. In other words, the technique of the present embodiment may be applied to the second or third embodiment. In this case, the output terminal 83 is capable of outputting a digital signal corresponding to at least one of the selective blowout of the fuses in the first partial recording region 261 and the circuit pattern in the second partial recording region 262.

Eleventh Embodiment

Figure 24:
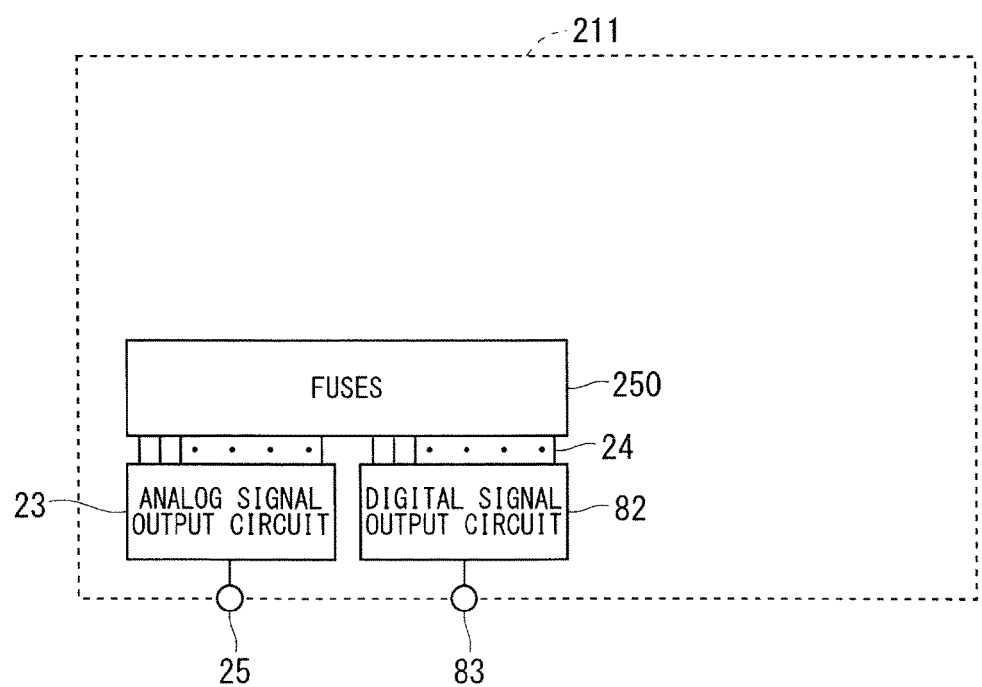
FIG. 24 is a block diagram schematically showing the configuration of the semiconductor chip according to an eleventh embodiment of the present invention.

Referring to FIG. 24, an IC chip 211 (semiconductor chip) according to the present embodiment includes the output terminals 25 and 83. Thus, the pieces of information recorded on the fuses in the information recording region 250 are outputted in a shared manner from the plurality of output terminals. Specifically, the output terminals are provided for the respective pieces of identification information recorded on the information recording region 250. This allows the use of any output scheme for each piece of identification information. In the example shown in the figure, the output terminal 25 from the analog signal output circuit 23 and the output terminal 83 from the digital signal output circuit 82 are provided. More generally, any combination of the signal output circuits in the aforementioned fourth to tenth embodiments and the respective terminals corresponding to the signal output circuits are provided. Also, the composite recording region 260 (FIG. 6) may be provided in place of the information recording region 250.

According to the present embodiment, the use of the output scheme suitable for each piece of identification information improves the reading efficiency of the pieces of identification information. Also, the adaptation of the output scheme to the usage condition of a product user improves the convenience of the use of the product.

Twelfth Embodiment

In the present embodiment, a method for managing property information on an IC chip (semiconductor chip) will be described which is a method for managing individual property information that is a property inherent in each of an IC chip group. A semiconductor chip group, a specific semiconductor chip in the semiconductor chip group, a semiconductor device group, and a specific semiconductor device in the semiconductor device group according to the aforementioned embodiments are generically referred to hereinafter as an IC chip group 200g, an IC chip 200p, a semiconductor device group 300g, and a semiconductor device 300p, respectively.

Figure 25:
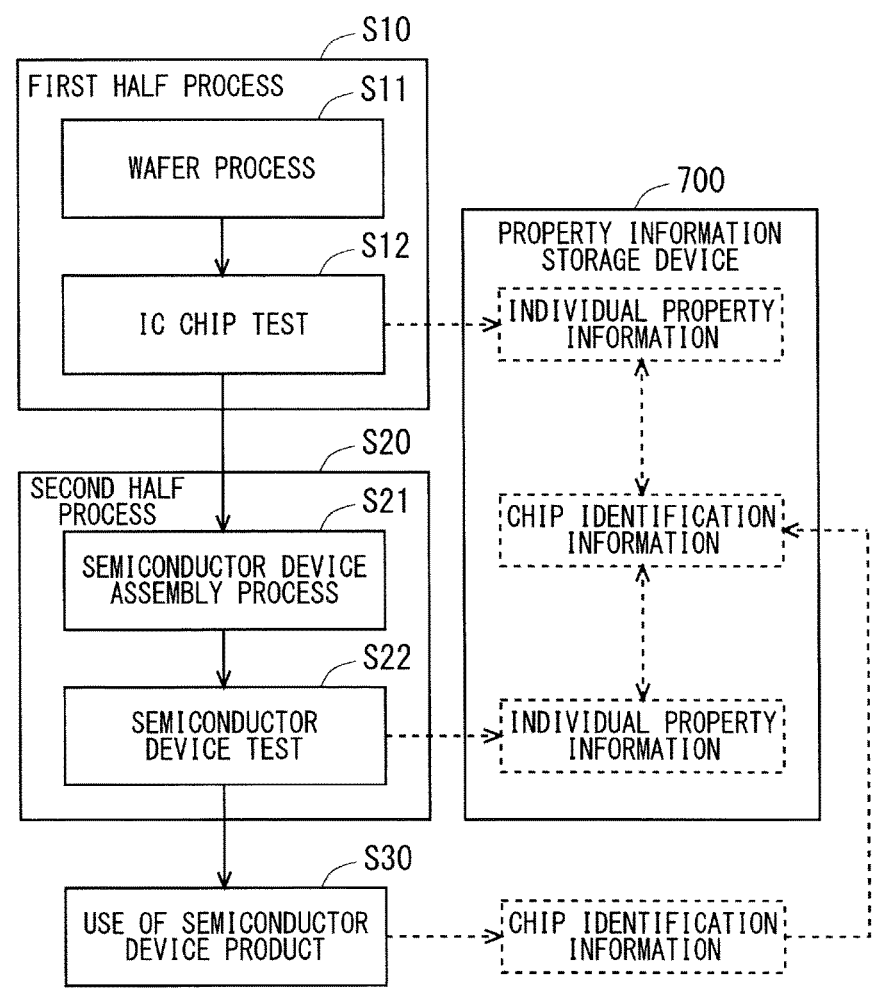
FIG. 25 is a flow diagram schematically showing the configuration of a method for manufacturing the semiconductor device in the case where a method for managing property information on the semiconductor chip is applied according to a twelfth embodiment of the present invention.

Referring to FIG. 25, a method for manufacturing the semiconductor device group 300g as mass-produced products will be described first. Initially, a first half process step is performed in Step S10. Specifically, the wafer process for the manufacture of the IC chip group 200g is performed in Step S11. A test is conducted on each IC chip group 200g in Step S12. A second half process step is performed in Step S20. Specifically, the semiconductor device assembly process is performed in Step S21. A test is conducted on each semiconductor device group 300g in Step S22. In each of the tests, the individual property information on each of the IC chip group 200g in relation to the chip identification information is stored in a property information storage device 700. The chip identification information is information which allows a specific IC chip 200p (one semiconductor chip) to be identified from among the IC chip group 200g. Thereafter, the semiconductor device group 300g is shipped to a user thereof.

In Step S30, each of the shipped semiconductor device group 300g is used as a product by the user. For example, an electrical device is manufactured using the semiconductor device group 300g. In this process, a product supplier receives an inquiry about the individual property information on the IC chip 200p mounted on a specific semiconductor device 300p, as required. To this end, the user acquires the chip identification information about the IC chip 200p from the semiconductor device 300p to transmit the acquired information to the product supplier.

Figure 26:
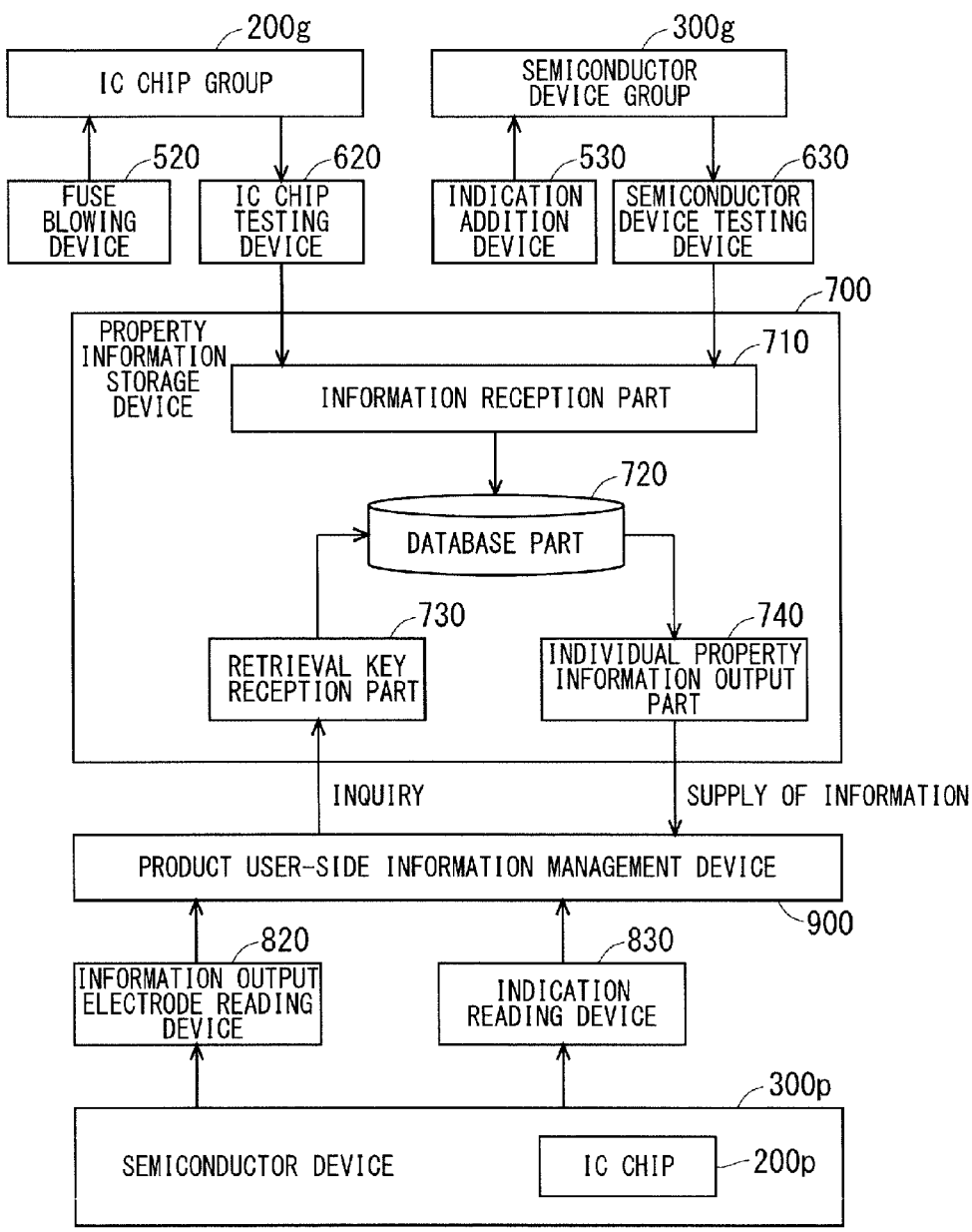
FIG. 26 is a block diagram illustrating the configuration of a system for use in the method for managing the property information shown in FIG. 25.

Referring to FIG. 26, devices related to the method for managing the property information will be described below.

A fuse blowing device 520 selectively blows the fuses described in the aforementioned embodiments. The blowout is achieved using laser light, for example. An indication addition device 530 is a device for adding the information addition region 451 (FIG. 1) onto the package. An example of the indication addition device 530 includes a bar code printer.

An IC chip testing device 620 tests each of the IC chip group 200g. A semiconductor device testing device 630 tests each of the semiconductor device group 300g.

The property information storage device 700 includes an information reception part 710, a database part 720, a retrieval key reception part 730, and an individual property information output part 740. The information reception part 710 receives a combination of the chip identification information and the individual property information. The database part 720 manages data on the combination of the chip identification information and the individual property information received by the information reception part 710. The retrieval key reception part 730 receives the chip identification information for the purpose of retrieval in the database part 720. The individual property information output part 740 outputs the individual property information retrieved using the chip identification information as a key.

An information output electrode reading device 820 uses the information output electrode 360 (FIG. 1) to read the chip identification information recorded on the IC chip 200p. An indication reading device 830 uses the information addition region 451 (FIG. 1) to read the chip identification information indicated on the package 401.

A product user-side information management device 900 passes the read chip identification information to the retrieval key reception part 730 of the property information storage device 700 to make an inquiry about the individual property information. The product user-side information management device 900 also receives the supply of the individual property information retrieved by the property information storage device 700 having received the inquiry. Preferably, the product user-side information management device 900 and the property information storage device 700 are connected by way of a network.

Figure 27:
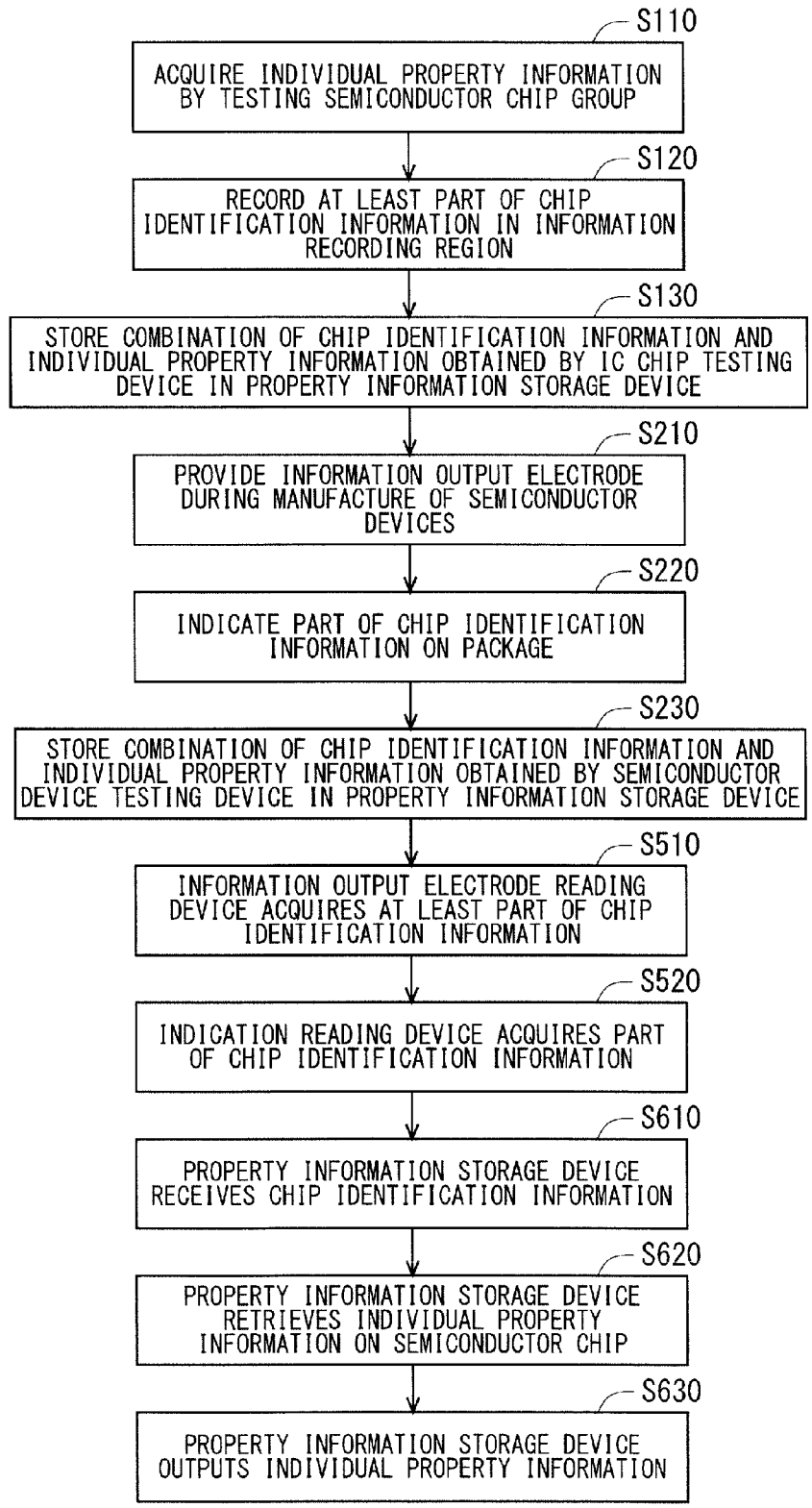
FIG. 27 is a flow diagram schematically showing the configuration of the method for managing the property information on the semiconductor chip according to the twelfth embodiment of the present invention.

Referring to FIG. 27, a flowchart will be described in the case where attention is given in particular on the method for managing the property information.

In Step S110, the IC chip testing device 620 acquires the individual property information by tests for the IC chip group 200g. In Step S120, the fuse blowing device 520 records at least part of the chip identification information by selective blowout of the fuses in the information recording region of each of the IC chip group 200g. As described in the second embodiment, the recording using the circuit pattern may be used at the same time. In Step S130, a combination of the chip identification information and the individual property information obtained by the IC chip testing device 620 is stored in the property information storage device 700.

In Step S210, the information output electrode 360 is provided during the manufacture of each semiconductor device of the semiconductor device group 300g. In Step S220, the indication addition device 530 adds the information addition region 451 onto the package 401 to indicate part of the chip identification information on the package 401. In Step S230, a combination of the chip identification information and the individual property information obtained by the semiconductor device testing device 630 is stored in the property information storage device 700.

In Step S510, the information output electrode reading device 820 acquires at least part of the chip identification information from the IC chip 200p sealed by the package 401 in the semiconductor device 300p. In Step S520, the indication reading device 830 acquires part of the chip identification information from the package 401.

In Step S610, the property information storage device 700 receives the chip identification information from the product user-side information management device 900. In Step S620, the property information storage device 700 uses the chip identification information as a retrieval key to retrieve the individual property information on the IC chip 200p from the database part 720. In Step S630, the property information storage device 700 outputs the individual property information on the IC chip 200p to the product user-side information management device 900. That is, the individual property information is supplied to the product user.

In the aforementioned description, part of the chip identification information is recorded on the IC chip whereas the remainder is indicated on the package as discussed in detail in the first embodiment. However, all of the chip identification information may be recorded on the IC chip. In this case, the indication addition device 530, the indication reading device 830, and Steps S220 and S520 are not required.

According to the present embodiment, the property information storage device is capable of bringing the chip identification information and the individual property information on a semiconductor chip into correspondence with each other.

The property information on the IC chip 200p is not stored in the IC chip 200p itself but is stored in the property information storage device 700. Thus, the IC chip 200p need not be configured to be capable of recording the property information, but is required to hold only the chip identification information. Therefore, a design change in the manufacture of the IC chip group 200g is not required if a change occurs in the necessary property information.

Also, the user of the semiconductor device as a product may use the information output electrode to read the chip identification information. This chip identification information may be used for the retrieval in the property information storage device, so that the individual property information on the semiconductor chip is acquired. This allows the user to use the product in consideration for the detailed properties thereof. Therefore, the convenience of the use of the product is improved.

The embodiments according to the present invention may be freely combined within the scope of the invention or the embodiments may be modified and dispensed with, as appropriate. While the invention has been described in detail, the foregoing description is in all aspects illustrative and not restrictive. It is understood that numerous other modifications and variations not illustrated can be devised without departing from the scope of the invention.

REFERENCE SIGNS LIST

DL Dicing lines; RP Resistive part; ST Shot regions; fa to fe Fuses; 23 Analog signal output circuit; 24 Aluminum interconnect lines; 25 and 83 Output terminals; 32, and 42 to 46 Constant current sources; 33 to 37, and 50 Resistive elements; 47 Variable current source; 52 Trigger generator circuit; 53 PWM circuit; 55 Reference voltage generator circuit; 56 Triangular wave oscillator; 57 Comparator; 62 Referencing constant current source; 63 Reference output terminal; 78 Reference input terminal; 82 Digital signal output circuit; 84 Clock generator circuit; 85 Multiplexer; 101 and 102 Wafers; 200g IC chip group (semiconductor chip group); 200p, 201, 202, 202a to 202h, and 204 to 211 IC chips (semiconductor chips); 250 Information recording region; 260 Composite recording region; 261 First partial recording region; 262, and 262a to 262h Second partial recording regions; 300g Semiconductor device group; 300p, and 301 to 303 Semiconductor devices; 360 Information output electrode; 390 Element electrodes; 401 and 402 Packages; 451 Information addition region; 520 Fuse blowing device; 530 Indication addition device; 620 IC chip testing device; 630 Semiconductor device testing device; 700 Property information storage device; 710 Information reception part; 720 Database part; 730 Retrieval key reception part; 740 Individual property information output part; 820 Information output electrode reading device; 830 Indication reading device; and 900 Product user-side information management device.

The invention claimed is:

1. A semiconductor device employing at least one of semiconductor chip groups, comprising:
one semiconductor chip included in said semiconductor chip groups, said one semiconductor chip including an information recording region on which is recorded a first piece of identification information indicating to which group of said semiconductor chip groups said one semiconductor chip belongs based on a first category, said information recording region including a plurality of fuses selectively blown in accordance with said first piece of identification information; and
a package sealing said semiconductor chip therein, said package having a second piece of identification information indicated thereon, said second piece of identification information indicating to which group of said semiconductor chip groups said one semiconductor chip belongs based on a second category, said first and second pieces of identification information being combined together to identify said one semiconductor chip from among said semiconductor chip groups, wherein said first piece of identification information alone does not uniquely identify said one semiconductor chip.

2. The semiconductor device according to claim 1, further comprising
at least one information output electrode electrically connected to said information recording region of said semiconductor chip and extending to the outside of said package.

3. A semiconductor device employing at least one of semiconductor chip groups, comprising:
one semiconductor chip included in said semiconductor chip groups, said one semiconductor chip including an information recording region on which is recorded a first piece of identification information indicating to which group of said semiconductor chip groups said one semiconductor chip belongs based on a first category, said information recording region including a plurality of fuses selectively blown in accordance with said first piece of identification information; and
a package sealing said semiconductor chip therein, said package having a second piece of identification information indicated thereon, said second piece of identification information indicating to which group of said semiconductor chip groups said one semiconductor chip belongs based on a second category, said first and second pieces of identification information being combined together to identify said one semiconductor chip from among said semiconductor chip groups, wherein
said information recording region included in said semiconductor chip includes a circuit pattern in accordance with said first piece of identification information, and
said fuses and said circuit pattern record said first piece of identification information thereon in a shared manner.

4. A semiconductor chip being one semiconductor chip of semiconductor chip groups, comprising:
a first partial recording region on which is recorded a first piece of identification information indicating to which group of said semiconductor chip groups said one semiconductor chip belongs based on a first category, said first partial recording region including a plurality of fuses selectively blown in accordance with said first piece of identification information; and
a second partial recording region on which is recorded a second piece of identification information indicating to which group of said semiconductor chip groups said one semiconductor chip belongs based on a second category, said second partial recording region including a circuit pattern patterned in accordance with said second piece of identification information, said first and second pieces of identification information being combined together to identify said one semiconductor chip from among said semiconductor chip groups.

5. The semiconductor chip according to claim 4, further comprising
at least one output terminal electrically connected to an information recording region having said first and second partial recording regions.

6. The semiconductor chip according to claim 5, further comprising
an analog signal output circuit for outputting an analog signal corresponding to said information recording region from said output terminal.

7. The semiconductor chip according to claim 6, wherein said analog signal includes at least one selected from the group consisting of a voltage signal, a current signal and a pulse signal.

8. The semiconductor chip according to claim 6, wherein said analog signal output circuit outputs a reference signal serving as a comparison criterion for said analog signal.

9. The semiconductor chip according to claim 6, wherein said analog signal output circuit receives a reference signal serving as a comparison criterion for said analog signal.

10. The semiconductor chip according to claim 5, further comprising
a digital signal output circuit for outputting a digital signal corresponding to said information recording region from said output terminal.

11. The semiconductor chip according to claim 5, wherein said output terminal is provided for each of pieces of identification information.

* * * * *